(12) United States Patent
Enomoto et al.

(10) Patent No.: US 6,170,323 B1
(45) Date of Patent: Jan. 9, 2001

(54) SELF-DIAGNOSIS APPARATUS FOR VEHICLE METERS AND METHOD STARTING A SELF-DIAGNOSIS MODE FOR VEHICLE METERS

(75) Inventors: Akihiro Enomoto; Masakazu Kobayashi, both of Saitama; Yoichiro Tanaka, Kanagawa, all of (JP)

(73) Assignees: Kansei Corporation, Saitama; Nissan Motor Co., Ltd., Kanagawa, both of (JP)

( * ) Notice: Under 35 U.S.C. 154(b), the term of this patent shall be extended for 0 days.

(21) Appl. No.: 08/902,253

(22) Filed: Jul. 29, 1997

(30) Foreign Application Priority Data

Jul. 26, 1996 (JP) .................................................... 8-199365

(51) Int. Cl.[7] .................................................. G01M 15/00
(52) U.S. Cl. ........................................... 73/118.1; 701/31
(58) Field of Search .................. 701/33, 31; 73/866.1, 73/866.2, 866.3, 432.1, 118.1, 117.3, 116

(56) References Cited

U.S. PATENT DOCUMENTS 5,174,238 * 12/1992 Ohike ................................... 73/866.1
5,446,655 * 8/1995 Fukuda et al. .......................... 701/33
5,767,425 * 6/1998 Miyagawa et al. .................. 73/866.3

FOREIGN PATENT DOCUMENTS 62-195776     12/1987    (JP) .

* cited by examiner

Primary Examiner—George Dombroske
(74) Attorney, Agent, or Firm—Sughrue, Mion, Zinn, Macpeak & Seas, PLLC

(57) ABSTRACT

A vehicle meter self-diagnosis apparatus includes cross coil movements 11, 13, 15, and 17, drivers 10, 12, 14, 16, and 18, a driver control circuit 20, a ROM 22 into which indication adjustment information of the cross coil movements 11, 13, 15, and 17 is written, a CPU 8, and a self-diagnosis control circuit section 30 being started by a reset switch 32 for driving the drivers 10, 12, 14, 16, and 18 and diagnosing the cross coil movements 11, 13, 15, and 17.

4 Claims, 12 Drawing Sheets

FIG.4

| NEEDLE INDICATION ANGLE | DUTY DURING NORMAL OPERATION (%) | | DUTY DURING SELF-DIAGNOSIS (%) | |
|---|---|---|---|---|
| | SIN | COS | SIN | COS |
| 0° | 0 | 100 | 0 | ANY (50) |
| 45° | 70.7 | 70.7 | ANY (50) | ANY (50) |

SELF-DIAGNOSIS APPARATUS FOR VEHICLE METERS AND METHOD STARTING A SELF-DIAGNOSIS MODE FOR VEHICLE METERS

BACKGROUND OF THE INVENTION

1. Field of the Invention

This invention relates to a vehicle meter self-diagnosis apparatus for diagnosing a condition such as a broken line or a short circuit of vehicle electric analog meters each using a cross coil movement and a method of starting a self-diagnosis mode of the self-diagnosis apparatus.

2. Description of the Related Art

If a meter seems to fail, a self-diagnosis apparatus is used to carry out a diagnosis for determining a failure place (the meter or a sensor) at a dealer or a service garage.

An apparatus shown in FIG. 11 is known as such a conventional vehicle meter self-diagnosis apparatus, for example, as disclosed in Japanese Utility Model Laid-Open No. Sho 62-195776. FIG. 11 is a circuit diagram to show a conventional vehicle meter self-diagnosis apparatus. FIG. 12 is a block diagram of a conventional self-diagnosis start control circuit. FIG. 13 is a block diagram of a conventional odo/trip signal processing circuit.

In FIG. 11, numeral 100 is an incorporated pseudo signal generation circuit, numeral 101 is a speed signal, numerals 102 and 104 are input circuits, numeral 103 is an engine rotation signal, numeral 105 is a fuel remaining amount signal, numeral 106 is a water temperature signal, numeral 107 is an A/D (analog-digital) converter, numeral 108 is a CPU (central processing unit) for performing signal processing, operations, etc., numeral 109 is an LCD (liquid crystal display) for producing odd/trip display, and numeral 110 is a driver for driving the LCD 109.

Numeral 111 is a speed meter made up of components such as a cross coil movement having a pair of coils placed so as to cross each other at an angle of 90 degrees and a moving magnet for indication placed rotatably under a magnetic field produced by the coils, numeral 112 is a driver for driving the speed meter 111, numeral 113 is a tachometer, numeral 114 is a driver for driving the tachometer 113, numeral 115 is a fuel gauge, numeral 116 is a driver for driving the fuel gauge 115, numeral 117 is a water temperature gauge, and numeral 118 is a driver for driving the water temperature gauge 117.

Numeral 120 is a driver control circuit for controlling the drivers 112, 114, 116, and 118 and numeral 122 is a ROM (read-only memory) of a nonvolatile memory into which indication adjustment information such as pointer swing angles of the speed meter 111, the tachometer 113, the fuel gauge 115, and the water temperature gauge 117 are written. Numeral 132 is an odd/trip meter reset switch.

In FIG. 12, numeral 140 is a self-diagnosis start control circuit being provided in the CPU 108 for the odo/trip LCD 109, the speed meter 111, the tachometer 113, the fuel gauge 115, and the water temperature gauge 117.

The self-diagnosis start control circuit 140 comprises a power supply sequence connected to a battery 150 via a power supply circuit 152, an odd/trip signal processing circuit 142 for performing predetermined signal processing to produce odd/trip display on the LCD 109, and an LCD driver interface 143 of an interface to the driver 110. Numeral 154 is an ignition switch.

As shown in FIG. 13, the odd/trip signal processing circuit 142 comprises a sensing section 142a for sensing that the ignition switch 154 is on or off and a data output section 142b for outputting segment data to the LCD driver interface 143 in response to output of the sensing section 142a. The output of the sensing section 142a is connected to the pseudo signal generation circuit 100.

Next, the operation will be discussed.

FIG. 14 is a flowchart to show the operation of the conventional vehicle meter self-diagnosis apparatus. While the reset switch 132 is turned on with the battery 150 on, the ignition switch 154 is turned on at step ST1. Then, the sensing section 142a senses that the ignition switch 154 is turned on, and control goes to step ST2.

If the reset switch 132 is not turned on and the ignition switch 154 is not turned on either, the LCD 109 does not go on. If the reset switch 132 is not turned on and the ignition switch 154 is turned on, the vehicles enter the normal operation mode.

At step ST2, the data output section 142b outputs predetermined segment data to the LCD driver interface 143 and the LCD driver interface 143 and the driver 110 check the LCD 109 for segments.

In the cross coil movement, the pseudo signal generation circuit 100 is also started by the operation and shifts to the self-diagnosis mode and the speed meter 111 the tachometer 113, the fuel gauge 115, and the water temperature gauge 117 are operated in response to indication adjustment information such as swing angles and sweep time preset as pseudo signals in the pseudo signal generation circuit 100. whether or not a failure occurs is determined according to the operation information.

An apparatus shown in FIG. 15 is known as another conventional vehicle meter self-diagnosis apparatus. In the figure, numeral 160 is a pseudo signal generator connected from the outside. Other components and the operation are similar to those in the conventional example described above and will not be discussed again.

Since the conventional vehicle meter self-diagnosis apparatus is thus configured, the input circuits 102 and 104, the A/D converter 107, the CPU 108, and the like with a large number of circuit elements and a high failure probability must be used to start the self-diagnosis mode. If the circuit itself fails, which of the circuit or the cross coil movement fails cannot be determined and the reliability of the self diagnosis is degraded.

Since the self-diagnosis mode is started only by turning on both the reset switch 132 and the ignition switch 154 at the same time, there is a possibility that general users will starts the self-diagnosis mode by mistake. Once the self-diagnosis mode is started by mistake, the meters are determined to fail.

Further, to use the pseudo signal generator 160 to carry out a self-diagnosis, the vehicle meters must be removed to input predetermined signals; it is difficult to carry out an easy and prompt diagnosis.

SUMMARY OF THE INVENTION

The invention has been made in view of the above circumstance, and therefore an object of the invention is to provide a vehicle meter self-diagnosis apparatus that can carry out an easy and prompt diagnosis with high reliability.

It is another object of the invention to provide a method of starting a vehicle meter self-diagnosis mode that can prevent general users from starting a self-diagnosis mode by mistake.

According to a first aspect of the invention, there is provided a vehicle meter self-diagnosis apparatus, comprising cross coil movements, drivers for driving the cross coil movements, a driver control circuit for controlling the drivers, a nonvolatile memory into which indication adjustment information of the cross coil movements is written, a central processing unit for inputting the indication adjustment information in the nonvolatile memory to the drive control circuit based on an input signal from a sensor and controlling the driver control circuit, and a self-diagnosis control circuit being started by start means, for driving the drivers and diagnosing the cross coil movements.

According to a second aspect of the invention, there is provided a method of starting a vehicle meter self-diagnosis mode, comprising the steps of: turning on power, turning on an ignition switch while turning on start means of a self-diagnosis control circuit for a predetermined time, and turning on the start means a predetermined number of times within a predetermined time after turning on the ignition switch, thereby starting a self-diagnosis mode for diagnosing vehicle meters.

The above and other objects and features of the present invention will be more apparent from the following description taken in conjunction with the accompanying drawings.

BRIEF DESCRIPTION OF THE DRAWINGS

FIG. 4 is a table indicating the relationship between pulse width modulation output duty and indication angles of cross coil movement drivers;

DETAILED DESCRIPTION OF THE PREFERRED EMBODIMENTS

Referring now to the accompanying drawings, a description will be given in more detail of a preferred embodiment of the invention.

Figure 1:
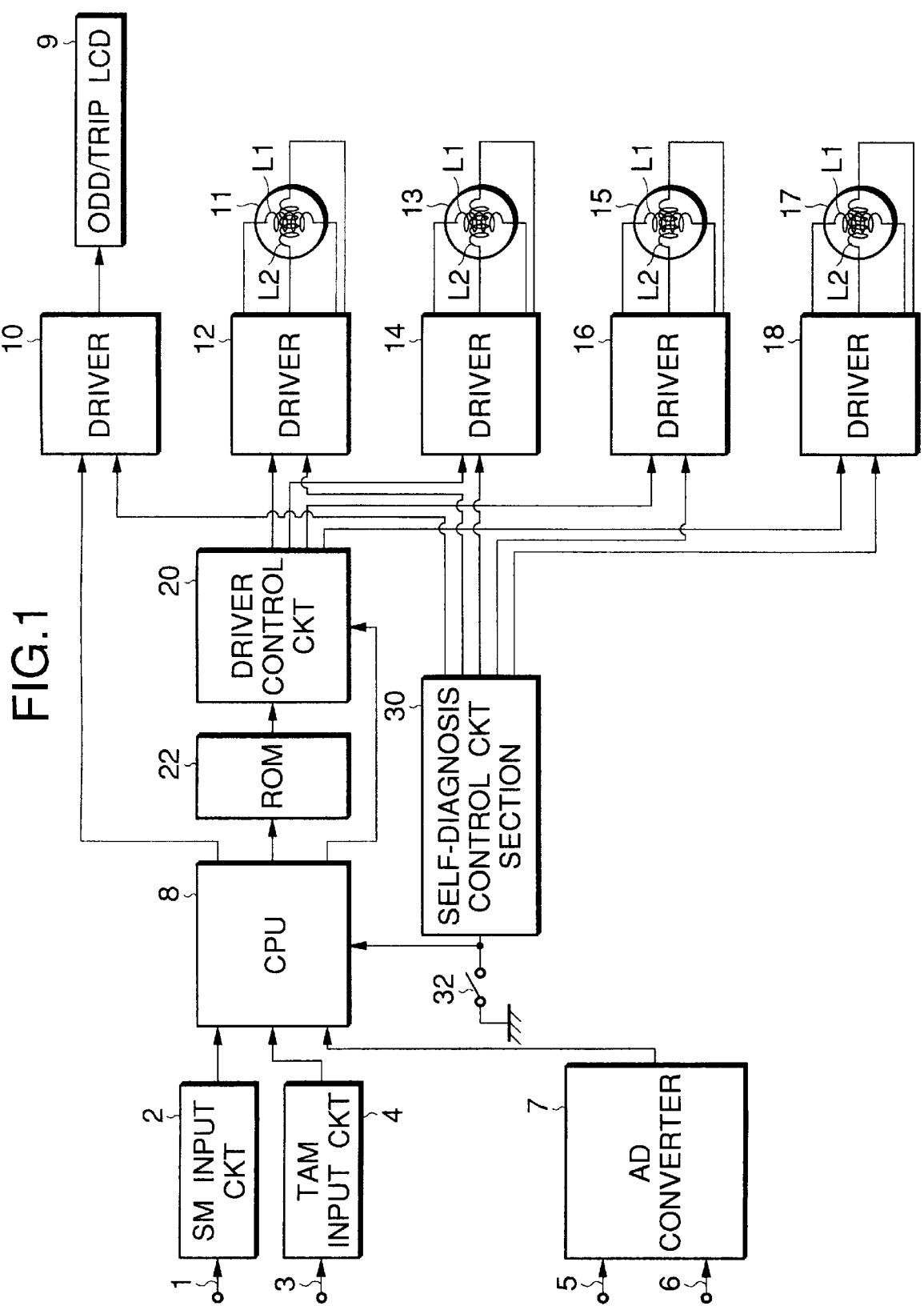
FIG. 1 is a circuit diagram to show a vehicle meter self-diagnosis apparatus according to a first embodiment of the invention.

FIG. 1 is a circuit diagram to show a vehicle meter self-diagnosis apparatus according to an embodiment of the invention. In FIG. 1, numeral 1 is a speed signal (input signal) from a sensor (not shown), numeral 2 is an input circuit of the speed signal 1, numeral 3 is an engine rotation signal (input signal) from a sensor (not shown), numeral 4 is an input circuit of the engine rotation signal 3, numeral 5 is a fuel remaining amount signal (input signal) from a sensor (not shown), numeral 6 is a water temperature signal (input signal) from a sensor (not shown), numeral 7 is an A/D converter for converting the fuel remaining amount signal 5 and the water temperature signal 6 from analog form into digital form, numeral 8 is a CPU for performing signal processing, operations, etc., numeral 9 is an LCD for producing odo/trip display, and numeral 10 is a driver for driving the LCD 9.

Numeral 11 is a speed meter (cross coil movement) comprising a coil L1 for causing a sine wave current to flow and a coil L2 for causing a cosine wave current to flow, the coils crossing each other, numeral 12 is a driver for driving the speed meter 11, numeral 13 is a tachometer (cross coil movement), numeral 14 is a driver for driving the tachometer 13, numeral 15 is a fuel meter (cross coil movement), numeral 16 is a driver for driving the fuel meter 15, numeral 17 is a water temperature gauge (cross coil movement), and numeral 18 is a driver for driving the water temperature gauge 17. Each of the drivers 12, 14, 16, and 18 has a circuit configuration shown in FIG. 2. A resistor connected to the coil L1, L2 in series in the figure can also be omitted.

Figure 2:
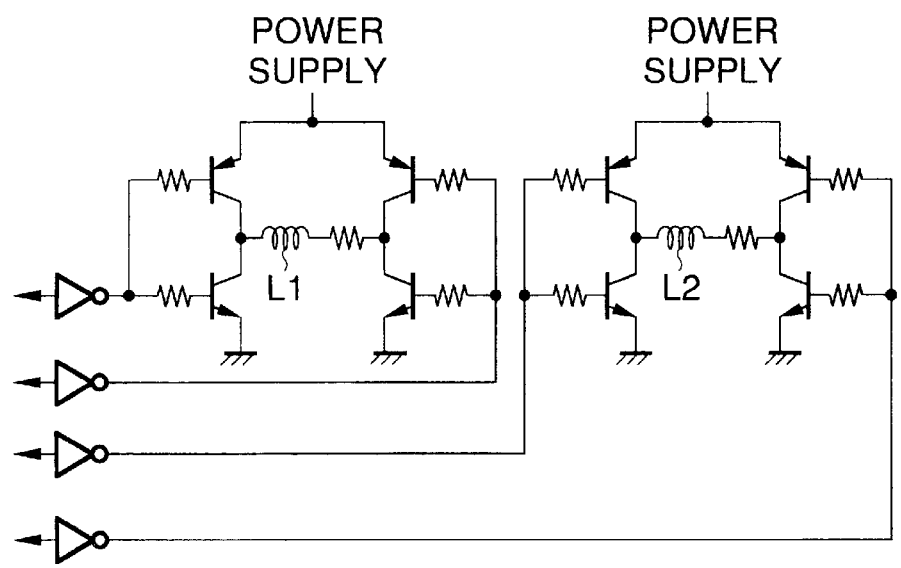
FIG. 2 is a circuit diagram of a cross coil movement driver.
Figure 3:
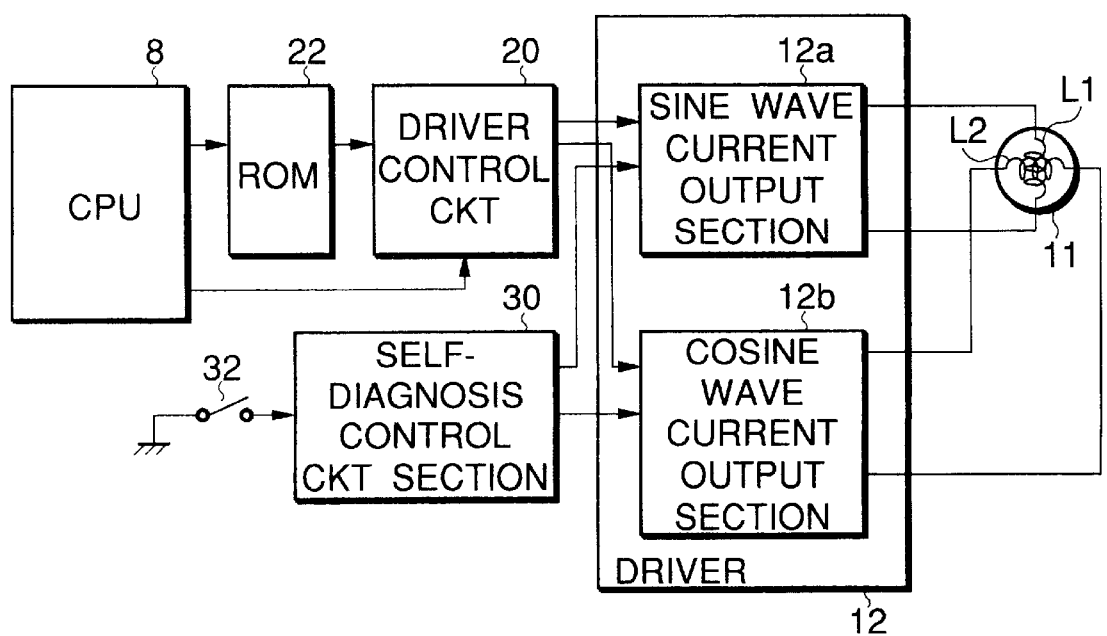
FIG. 3 is a main part circuit diagram centering around a speed meter driver.
Figure 5:
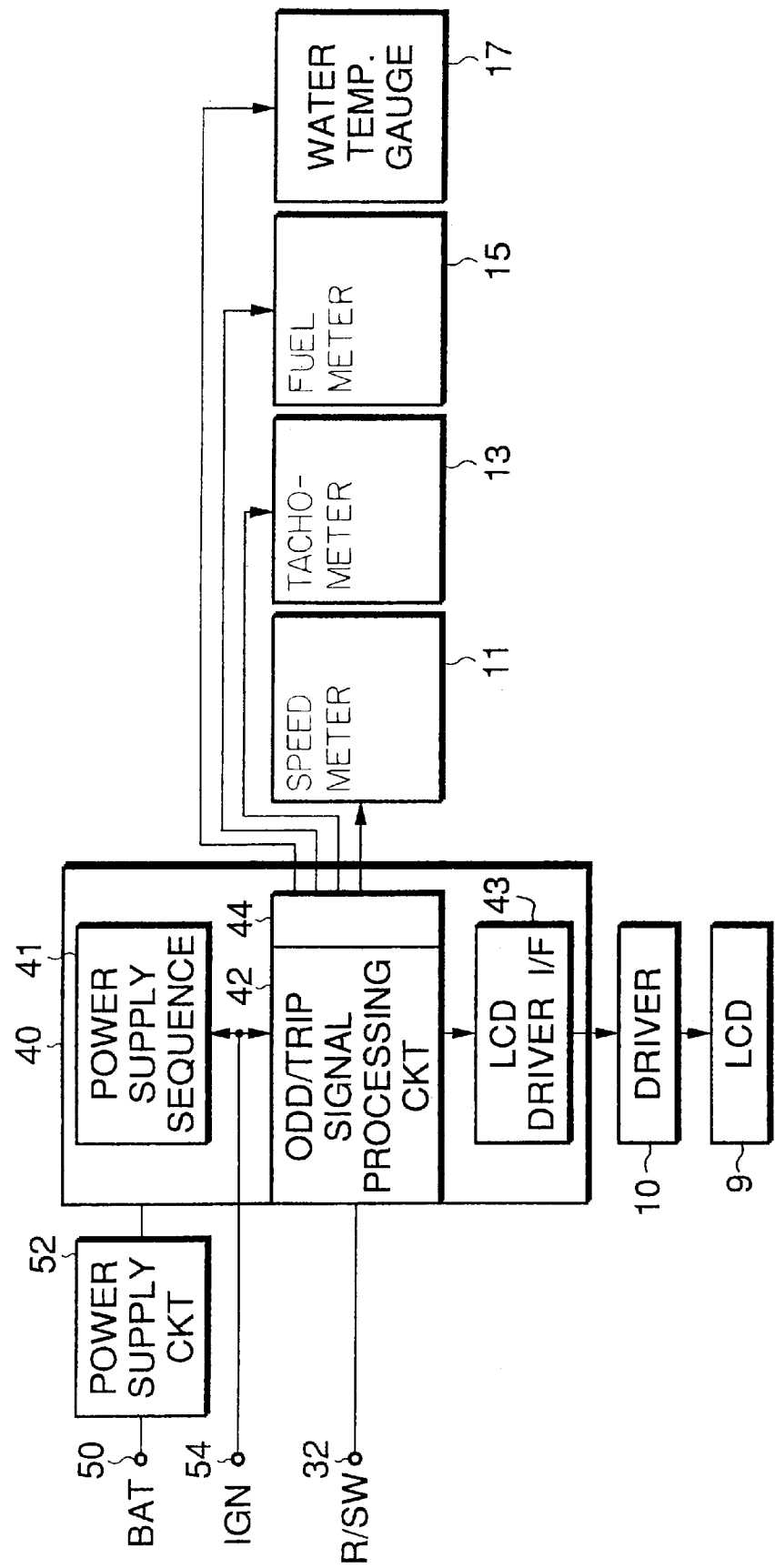
FIG. 5 is a block diagram of a self-diagnosis control IC.

Output transistors of the driver 12 shown in FIG. 2 can be controlled by a drive current output from a sine wave current output section 12a and a cosine wave current output section 12b by pulse width modulation (Pwm), as shown in FIG. 3. Other drivers 14, 16, and 18 also have a similar configuration although not shown.

Numeral 20 is a drive control circuit for controlling the drivers 12, 14, 16, and 18 and numeral 22 is a ROM of a nonvolatile memory into which indication adjustment information such as pointer swing angles of the speed meter 11, the tachometer 13, the fuel gauge 15, and the water temperature gauge 17 are written.

The ROM 22 is formed so that pulse width modulation output is converted into data (duty) corresponding to indication angles of the pointers of the speed meter 11, the tachometer 13, the fuel gauge 15, and the water temperature gauge 17, as shown in FIG. 4. That is, to operate the speed meter 11, etc., in the normal mode, the ROM 22 is set so that the pointer indication angle becomes 0 degrees when the sine wave duty is 0% and the cosine wave duty is 100% and that the pointer indication angle becomes 45 degrees when the sine wave duty and the cosine wave duty are both 70.7%.

On the other hand, to operate the speed meter 11, etc., in the self-diagnosis mode, the ROM 22 is set so that the pointer indication angle becomes 0 degrees when the sine wave duty is 0% and the cosine wave duty is any value other than 0% (for example, 50%) and that the pointer indication angle becomes 45 degrees when the sine wave duty and the cosine wave duty are any equal value (for example, 50%) in a self-diagnosis swing angle data setting section 42e of a self-diagnosis control circuit section 30 (described later).

Numeral 30 is a self-diagnosis control circuit section for checking the LCD 9 for segments and the speed meter 11, the tachometer 13, the fuel gauge 15, and the water temperature gauge 17 for a broken line, a short circuit, etc., by directly driving the drivers 10, 12, 14, 16, and 18 of the LCD 9, the speed meter 11, the tachometer 13, the fuel gauge 15, and the water temperature gauge 17. Numeral 32 is a reset switch (start means) for starting the self-diagnosis control circuit section 30. In the embodiment, switch output of a reset knob of an odo/trip meter is used as the reset switch.

Numeral 40 is a self-diagnosis control IC (self-diagnosis control circuit) into which the self-diagnosis control circuit section 30 and the drivers 12, 14, 16, 18, etc., are integrated. That is, the self-diagnosis control IC 40 comprises a power supply sequence 41 connected to a battery (power source) 50 via a power supply circuit 52, an odo/trip signal processing circuit 42 for performing predetermined signal processing to produce odo/trip display on the LCD 9, a movement driver 44 consisting of the drivers 12, 14, 16, and 18, and an LCD driver interface 43 of an interface to the driver 10.

The movement driver 44 is formed so as to be able to drive the speed meter 11, etc., in accordance with the data set in the self-diagnosis swing angle data setting section 42e in the odo/trip signal processing circuit 42.

Figure 6:
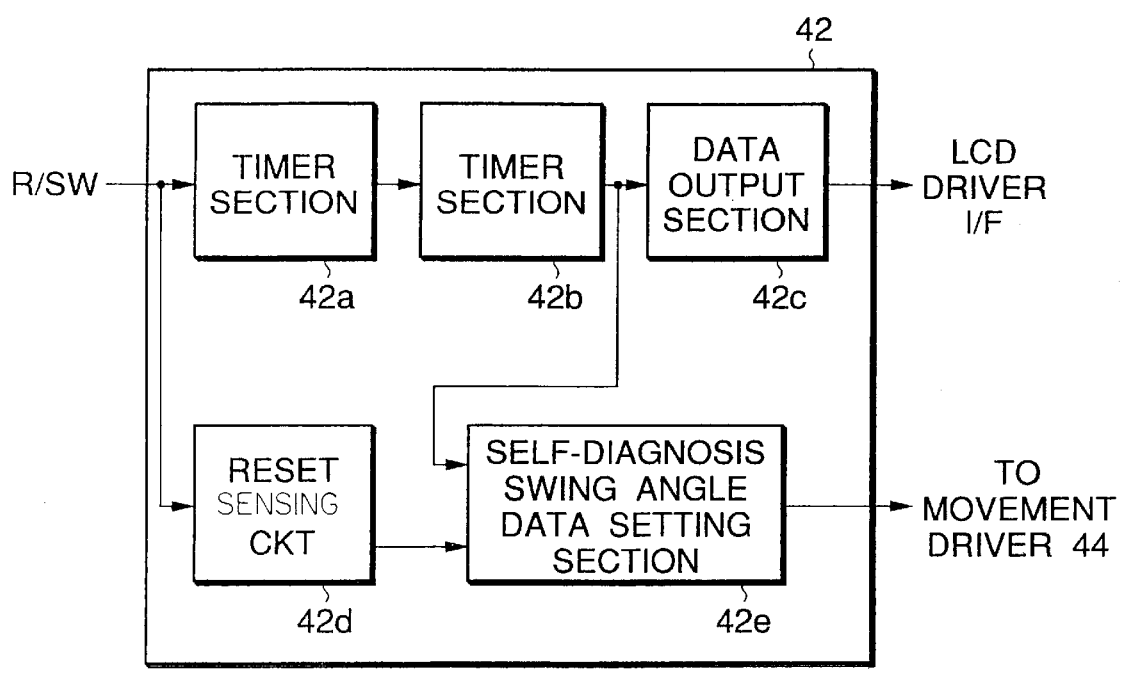
FIG. 6 is a block diagram of an odo/trip signal processing circuit.

The odo/trip signal processing circuit 42 comprises a timer section 42a for sensing that an ignition switch 54 is on or off, a timer section 42b sensing that the reset switch 32 of the self-diagnosis mode start means is on or off, and a data output section 42c for outputting segment data to the LCD driver interface 43 in response to output of the timer sections 42a and 42b, as shown in FIG. 6. The output of the timer sections 42a and 42b is connected to the self-diagnosis swing angle data setting section 42e together with output of a reset sensing circuit 42d for determining whether the reset switch 32 is on or off, and output of the self-diagnosis swing angle data setting section 42e is connected to the movement driver 44. Time conditions, etc., of the timer sections 42a and 42b can be set to any desired values.

Figure 7:
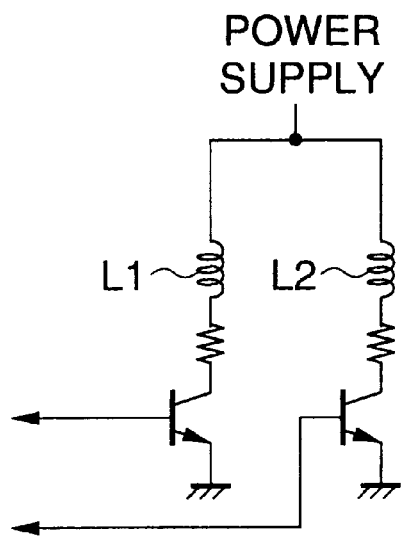
FIG. 7 is a circuit diagram of another cross coil movement driver.
Figure 8:
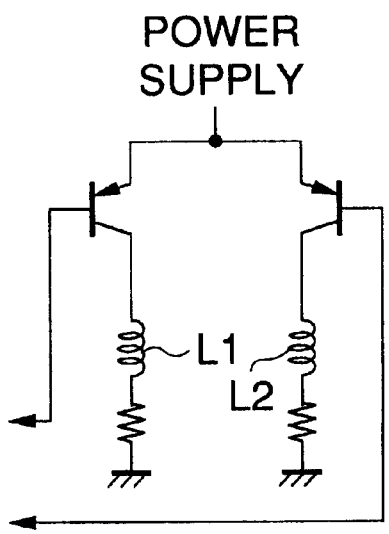
FIG. 8 is a circuit diagram of another cross coil movement driver.

In the description, FIG. 2 is used as the circuit example of the driver 12, 14, 16, 18, but a configuration shown in FIG. 7 or 8 can also be adopted. In the description, it is assumed that the output transistors of the drivers 12, etc., are controlled by pulse width modulation output, but so-called on/off control can also be performed.

Next, the operation of the vehicle meter self-diagnosis apparatus will be discussed.

Figure 9:
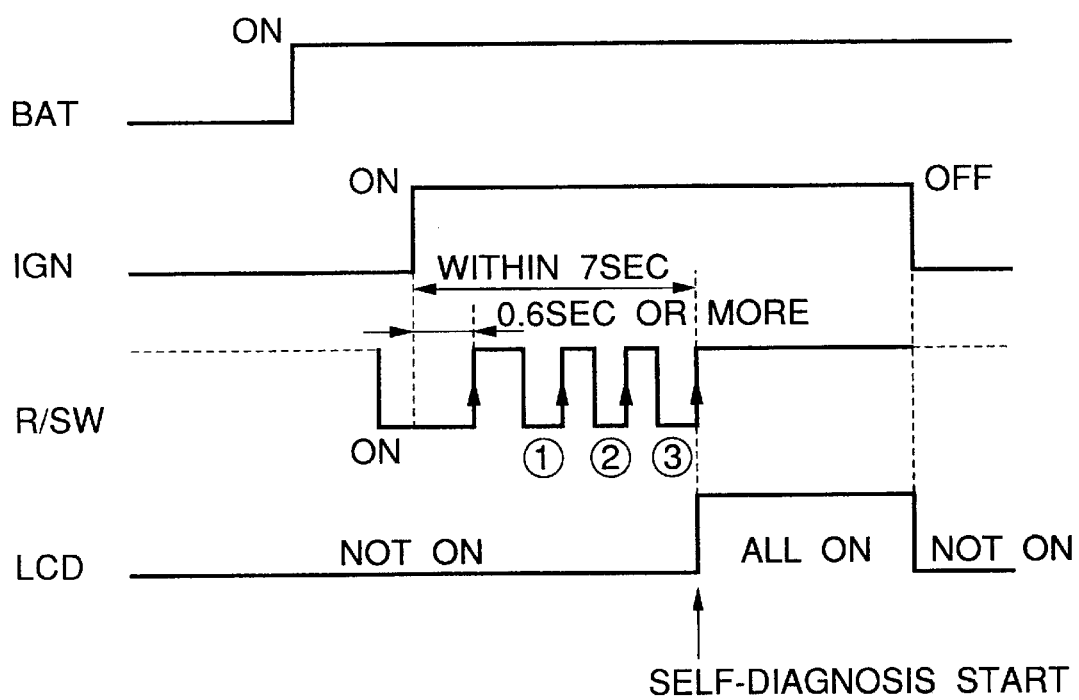
FIG. 9 is a time chart to show the operation of the vehicle meter self-diagnosis apparatus.
Figure 10:
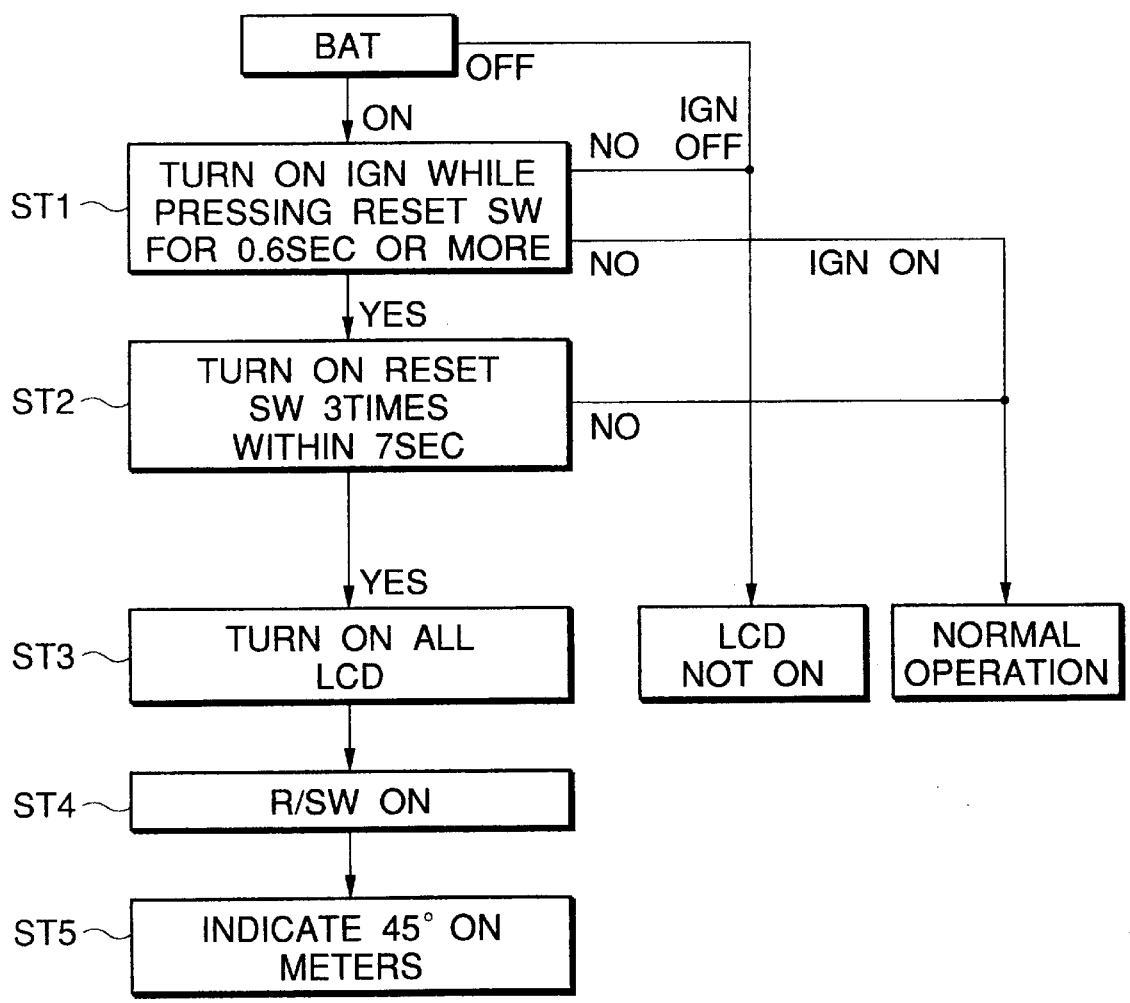
FIG. 10 is a flowchart to show the operation of the vehicle meter self-diagnosis apparatus.
Figure 11:
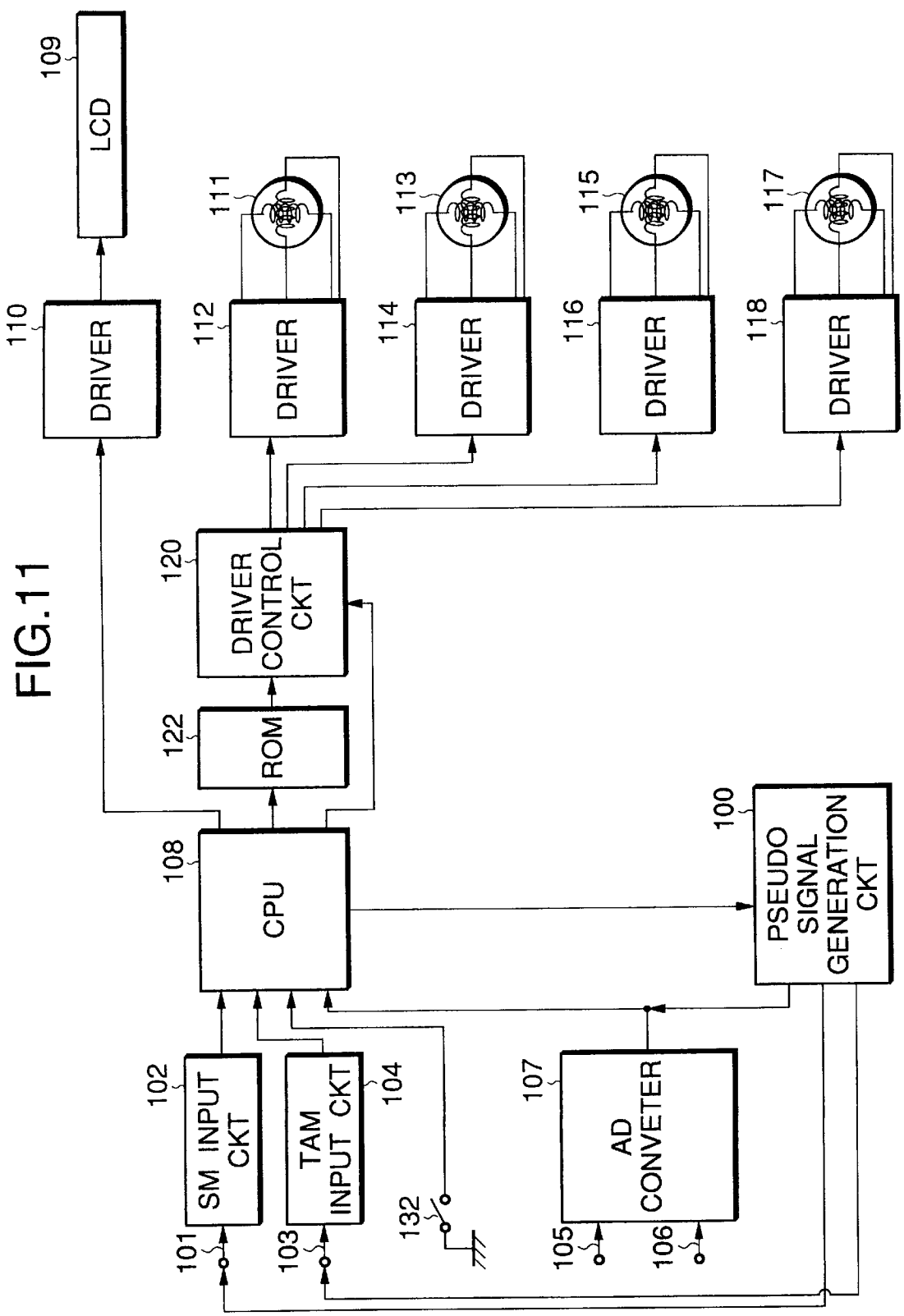
FIG. 11 is a circuit diagram to show a conventional vehicle meter self-diagnosis apparatus.
Figure 12:
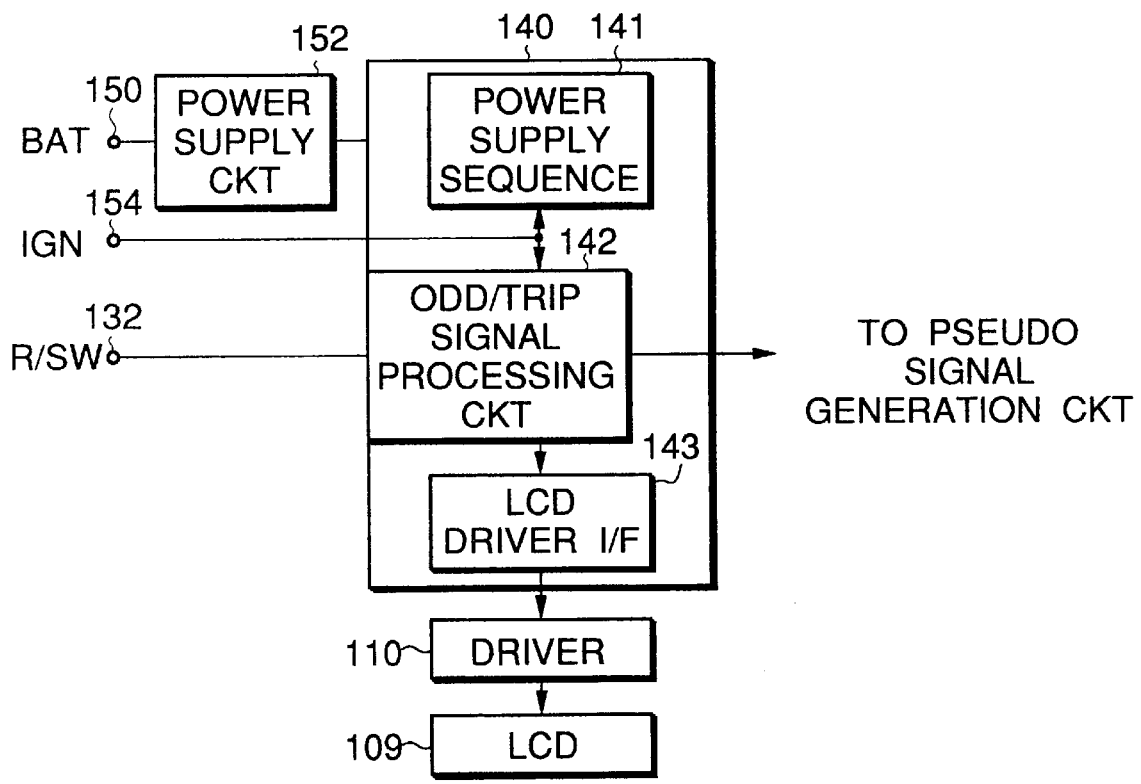
FIG. 12 is a block diagram of a conventional self-diagnosis start control circuit.
Figure 13:
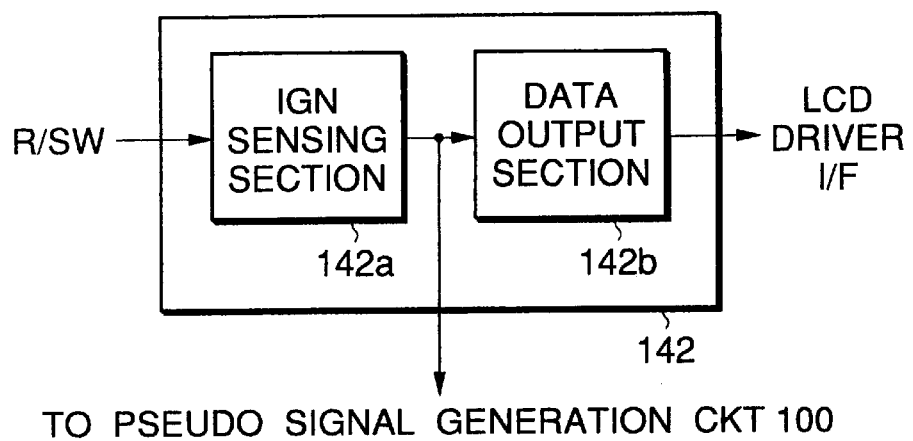
FIG. 13 is a block diagram of a conventional odo/trip signal processing circuit.
Figure 14:
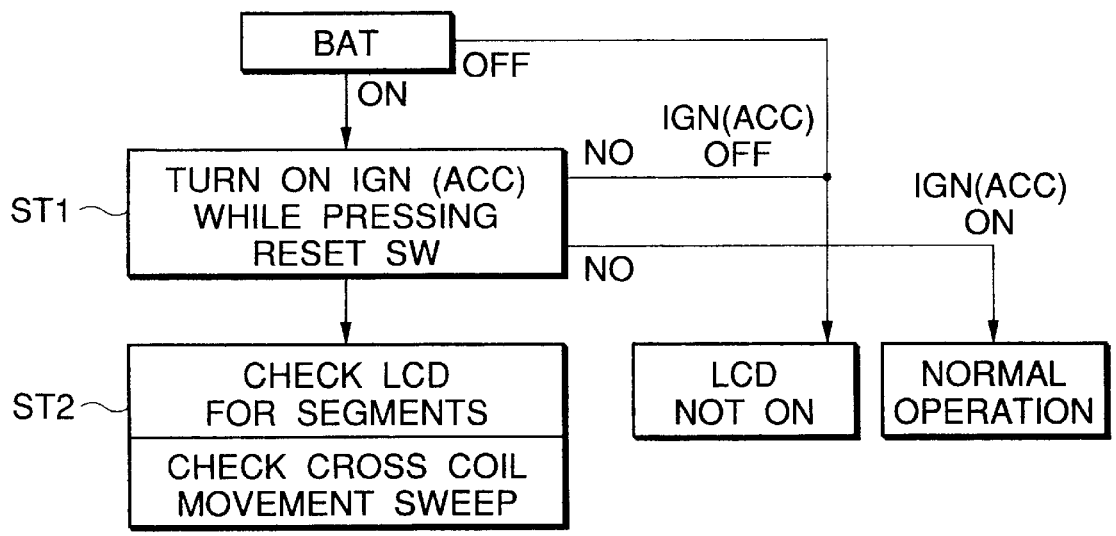
FIG. 14 is a flowchart to show the operation of the conventional vehicle meter self-diagnosis apparatus.
Figure 15:
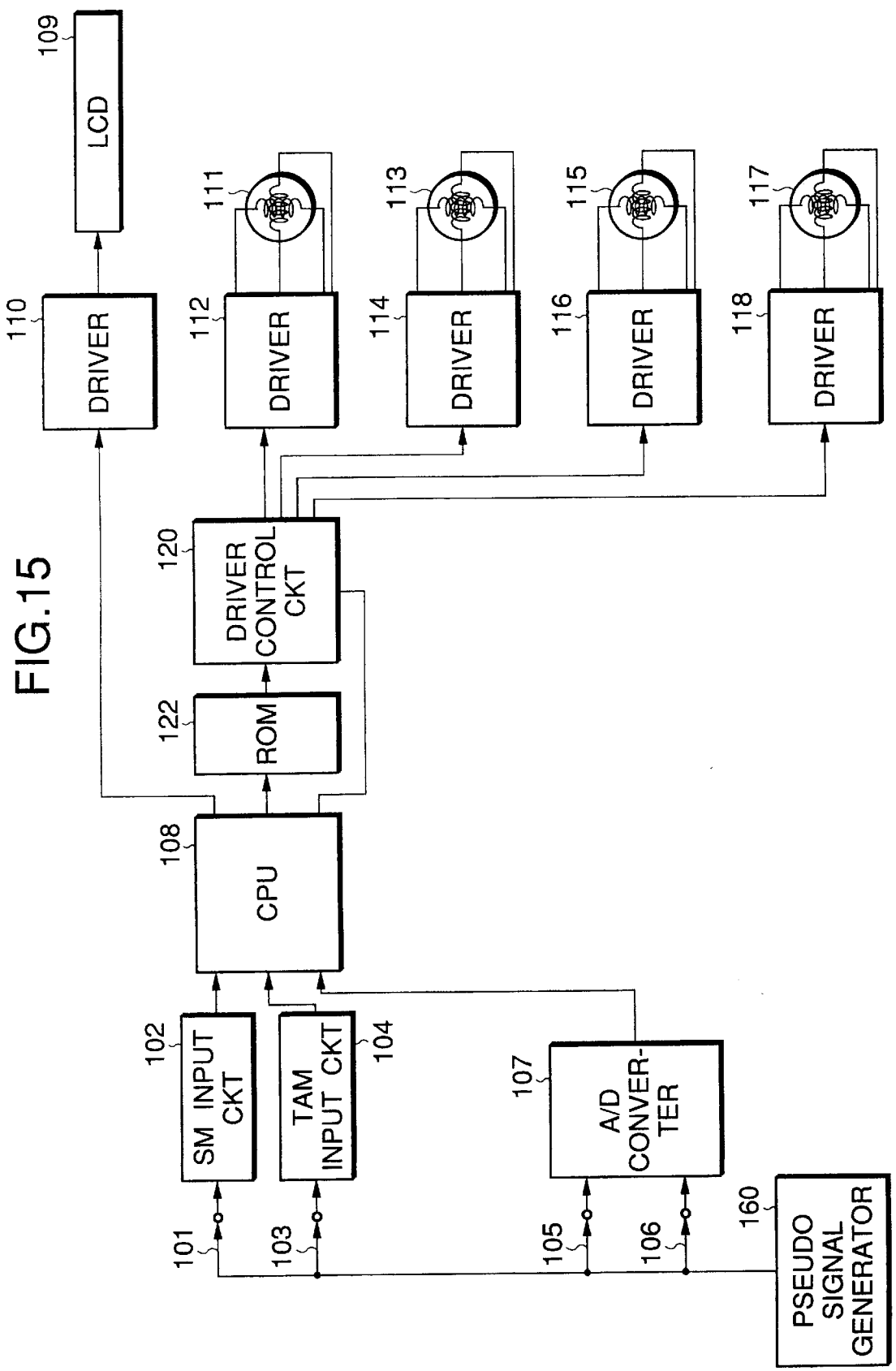
FIG. 15 is a circuit diagram to show another conventional vehicle meter self-diagnosis apparatus.

FIG. 9 is a time chart to show the operation of the vehicle meter self-diagnosis apparatus. FIG. 10 is a flowchart to show the operation of the vehicle meter self-diagnosis apparatus.

First, operating the vehicle meter self-diagnosis apparatus and starting the self-diagnosis mode will be discussed. At step ST1 in FIG. 10, while the reset switch 32 is turned on for a given time or more (for example, 0.6 seconds or more) with the battery 50 on, the ignition switch 54 is turned on. The elapsed time since the ignition switch 54 was turned on is sensed by the timer section 42a of the odo/trip signal processing circuit 42.

On the other hand, if the reset switch 32 is not turned on for a given time or more (for example, less than 0.6 seconds) and the ignition switch 54 is not turned on, the LCD 9 does not go on. If the reset switch 32 is not turned on for a given time or more (for example, less than 0.6 seconds) and the ignition switch 54 is turned on, the vehicle meters enter the normal operation mode.

Next, at step ST2, the reset switch 32 is turned on a predetermined number of times (for example, three times) within a given time since the ignition switch 54 was turned on (for example, within 7 seconds). In this case, the timer section 42b counts pulses of the reset switch 32.

On the other hand, if the reset switch 32 is not turned on a predetermined number of times (for example, three times) within a given time since the ignition switch 54 was turned on (for example, within 7 seconds), the vehicle meters enter the normal operation mode.

When the rising edge of the last pulse of the reset switch 32 is sensed, at step ST3, the data output section 42c outputs predetermined segment data to the LCD drive interface 43 and the LCD drive interface 43 and the driver 10 turn on all the LCD 9, the LCD 9 entering the self-diagnosis mode. When the operation is performed, the speed meter 11, the tachometer 13, the fuel gauge 15, and the water temperature gauge 17 also 25 shift to the self-diagnosis mode.

When the reset switch 32 is turned on at step ST4, signals of any values having an equal duty ratio are supplied to the coils L1 and L2. If the speed meter 11, the tachometer 13, the fuel gauge 15, and the water temperature gauge 17 are normal, their pointers indicate an angle of 45 degrees at step SP5. When the reset switch 32 is off, 0 is supplied to the coil L1 and a signal of any value is supplied to the coil L2, indicating an angle of 0 degrees.

Therefore, if any of the speed meter 11, the tachometer 13, the fuel gauge 15, and the water temperature gauge 17 is abnormal, the following determination can be made easily and promptly based on the pointer indication angles:

(1) If the pointer does not swing at all, the coil L2 is broken or short-circuited or both the coils L1 and L2 are broken or short-circuited;

(2) if the pointer indicates 90 degrees, the coil L2 is broken or short-circuited.

In FIG. 10, it the battery 50 is turned off or if the battery 50 is turned on and the ignition switch 54 is turned off, the LCD 9 does not go on. The self-diagnosis mode is canceled if the engine is started.

Thus, the worker can determine easily and promptly whether or not the speed meter 11, etc., fails by checking only whether or not the pointers of the speed meter 11, the tachometer 13, the fuel gauge 15, and the water temperature gauge 17 indicate angles of 0 and 45 degrees. Since the conventional self-diagnosis circuit sweeps the cross coil movement swing angle at a full scale, a pseudo signal changing like a sine wave is required. A circuit for generating the pseudo signal is complicated and the reliability may be degraded, leading to an increase in costs. However, as in the circuit configuration, the pointers are made to indicate angles of 0 and 45 degrees by turning on/off the reset switch 32, whereby the configuration can be extremely simplified and the reliability can be enhanced at low costs. In a cross coil movement of a set pointer system often used with a fuel gauge, etc., (if the power is turned off, the indication angle set before the power is turned off is held), a diagnosis can also be easily carried out by checking the two points described above.

As we have discussed, according to the first embodiment of the invention, a vehicle meter self-diagnosis can be easily and promptly carried out by the extremely simple circuit configuration.

The self-diagnosis control circuit section 30 can directly drive the drivers 10, 12, 14, 16, and 18 and a diagnosis can be carried out without using the input circuits 2 and 4, etc., as in the conventional self-diagnosis apparatus, so that the reliability can be improved.

Further, to start the self-diagnosis mode, simple restriction conditions at steps ST1 and ST2 are provided, thus the general user can be prevented from starting the self-diagnosis mode by mistake.

A position of the ignition switch when starting a self-diagnosis mode is not limited by or to the on-position of the ignition switch as described in the above embodiment, but may be another position, for example, an accessary position of the ignition switch, etc., where a power can be supplied to the meters.

As we have discussed, according to the first aspect of the invention, the vehicle meter self-diagnosis apparatus is configured so as to comprise cross coil movements, drivers for driving the cross coil movements, a driver control circuit for controlling the drivers, a nonvolatile memory into which indication adjustment information of the cross coil movements is written, a central processing unit for inputting the indication adjustment information in the nonvolatile memory to the driver control circuit based on an input signal from a sensor and controlling the driver control circuit, and a self-diagnosis control circuit being started by start means for driving the drivers and diagnosing the cross coil movements. Thus, the vehicle meter self-diagnosis apparatus that can carry out an easy and prompt diagnosis with high reliability can be provided.

According to the second aspect of the invention, the method of starting the vehicle meter self-diagnosis mode comprises the steps of: turning on power, turning on an ignition switch while turning on start means of a self-diagnosis control circuit for a predetermined time, and turning on the start means a predetermined number of times within a predetermined time after turning on the ignition switch, thereby starting a self-diagnosis mode for diagnosing vehicle meters. Thus, the method of starting the vehicle meter self-diagnosis mode that can prevent general users from starting the self-diagnosis mode by mistake can be provided.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A vehicle meter self-diagnosis apparatus, comprising:
   a plurality of cross coil movements;
   a plurality of drivers for driving said cross coil movements, correspondingly;
   a driver control circuit for controlling said drivers;
   a nonvolatile memory into which indication adjustment information of said cross coil movements is written;
   a central processing unit for inputting the indication adjustment information in said nonvolatile memory to said drive control circuit according to an input signal from a sensor and for controlling said driver control circuit; and
   a self-diagnosis control circuit being started by start means, for directly driving said drivers and diagnosing said cross coil movements.

2. A vehicle meter self-diagnosis apparatus as claimed in claim 1, wherein each of said drivers comprises a waveform current output section for forming a plurality of waveforms out of phase.

3. A vehicle meter self-diagnosis apparatus as claimed in claim 1, wherein said self-diagnosis control circuit and said drivers are integrated into an IC.

4. A method of starting a self-diagnosis mode for vehicle meters, comprising the steps of:
   turning on power;
   turning on an ignition switch while turning on start means of a self-diagnosis control circuit for a predetermined time; and
   turning on said start means a predetermined number of times within a predetermined time after turning on the ignition switch, to start a self-diagnosis mode for diagnosing vehicle meters.

* * * * *